(12) United States Patent
McGrath

(10) Patent No.: US 6,574,649 B2
(45) Date of Patent: Jun. 3, 2003

(54) EFFICIENT CONVOLUTION METHOD AND APPARATUS

(75) Inventor: David Stanley McGrath, Ultimo (AU)

(73) Assignee: Lake Technology Limited, New South Wales (AU)

(*) Notice: Subject to any disclaimer, the term of this patent is extended or adjusted under 35 U.S.C. 154(b) by 0 days.

(21) Appl. No.: 09/888,053

(22) Filed: Jun. 22, 2001

(65) Prior Publication Data

US 2002/0116422 A1 Aug. 22, 2002

Related U.S. Application Data

(63) Continuation of application No. PCT/AU99/01170, filed on Dec. 23, 1999.

(30) Foreign Application Priority Data

Dec. 23, 1998 (AU) .............................................. PP7905

(51) Int. Cl.[7] .............................................. G06F 17/15
(52) U.S. Cl. ...................... 708/420; 708/319; 708/422
(58) Field of Search ................................ 708/420, 422, 708/425, 319

(56) References Cited

U.S. PATENT DOCUMENTS

| | | | |
|---|---|---|---|
| 5,151,953 A | * | 9/1992 | Landeta ....................... 382/279 |
| 5,163,100 A | * | 11/1992 | Mathieu et al. ............. 348/606 |
| 5,311,459 A | * | 5/1994 | D'Luna et al. ............. 708/319 |
| 5,814,750 A | | 9/1998 | Wang et al. ................... 84/602 |

FOREIGN PATENT DOCUMENTS

| | | | |
|---|---|---|---|
| EP | 0 250 048 A1 | 12/1987 | .......... H03H/21/00 |
| GB | 2 284 285 A | 5/1995 | ............ G06F/17/15 |
| WO | WO 94/01933 | 1/1994 | .......... H03H/17/06 |
| WO | WO 98/49775 | 11/1998 | .......... H03H/17/06 |

* cited by examiner

*Primary Examiner*—David H. Malzahn
(74) *Attorney, Agent, or Firm*—Fulwider Patton Lee & Utecht, LLP

(57) ABSTRACT

A convolution method and apparatus of time domain convolving an input signal with a second signal is disclosed comprising the steps of; dividing the second signal into a series of segments; determining a magnitude envelope for each of the segments; scaling the signal values within each segments relative to the envelope to produce corresponding segment scaled signal values; multiplying the segment scaled values by a corresponding input signal value to produce corresponding segment output values; scaling the segment output values by a segment scale factor to produce corresponding scaled segment outputs; and adding the scaled segment output to produce a time domain output.

33 Claims, 10 Drawing Sheets

EFFICIENT CONVOLUTION METHOD AND APPARATUS

This application is a continuation of PCT/AU99/01170, with an international filing date of Dec. 23, 1999, which was published in English under PCT Article 21(2) on Jul. 6, 2000.

FIELD OF THE INVENTION

The present invention relates to convolution of signals and, in particular, discloses an efficient form of time domain based convolution.

BACKGROUND OF THE INVENTION

The process of convolution is well known to those skilled in the art of signal processing and normally involves convolving two different signals together to produce an output signal. Turning initially to FIG. 1, in the audio processing field, it is common to convolve 1 an input signal 2 with an impulse response 3 to produce an output signal 4. The convolution process can be utilised to equalise or add spatial components to the audio input signal 2 so as to add "color" to the input signal.

Unfortunately, the convolution process can involve excessive computational resources. In one efficient form of known convolution process, hereinafter termed a "frequency domain convolution process", an example of which is depicted in FIG. 2, the input signal 2 is converted into the frequency domain by means of a Fast Fourier Transform (FFT) 6. The impulse response is similarly converted to the fourier domain by a Fast Fourier Transform process 7. The two fourier components are then multiplied element-by-element 8 with the result being Inverse Fast Fourier Transformed (IFFT) 9 to produce a convolved output signal 10. The process of FIG. 2 is well known in the art, and there are many other efficient methods for carrying out a fourier domain convolution on input signals. An example of an efficient form of frequency domain process is given in PCT International Application No. PCT/AU93100330 entitled "Digital Filter Having High Accuracy and Efficiency" assigned to the present applicant.

Another known form of performing a convolution process is in the time domain and is illustrated in FIG. 3. In this process 20, an input signal 21 is forwarded to a series of delay blocks 22 with the output of the delay block 22 being forwarded to a subsequent delay block eg 23 in addition to being multiplied 24 with a coefficient $a_1$. The outputs of each of the coefficient multiplications are then summed 26 to form an output 27. Hence, (for each time step input 21), the following summation, which represents a convolution, is formed.

$$y(n) = \sum_{i=0}^{N-1} a_i x(n-i)$$

Unfortunately, the time domain convolution process requires an excessive amount of computational resources and, as a result, the frequency domain process of FIG. 2 is more likely to be utilised in instances where the impulse response length, N, is large.

In any convolution process, and in particular audio convolution with an impulse response function, it is desired to perform as efficient and effective a convolution as possible. It would therefore be desirable to provide for an alternative efficient convolution process.

SUMMARY OF THE INVENTION

It is an object of the present invention to provide for an efficient convolution process.

In accordance with a first aspect of the present invention, there is provided a convolution method of time domain convolving an input signal with a second signal comprising the steps of: (a) dividing the second signal into a series of segments; (b) determining a magnitude envelope for each of the segments; (c) scaling the signal values within each segment relative to the envelope to produce corresponding segment scaled signal values; (d) multiplying the segment scaled signal values by a corresponding input signal value to produce corresponding segment output values; (e) scaling the segment output values by a segment scale factor to produce corresponding scaled segment outputs; and (f) adding the scaled segment outputs to produce a time domain output.

The scaling step (c) further can comprise a quantisation of the signal values within each segment. The segment scaled signal values can be quantised so that the quantisation noise is spectrally altered to reduce the impact of the quantisation process. The quantisation process can be further adapted to simplify the use of the segment scaled signal values in a multiplication process. For example, preferably the quantisation process is further adapted so that each element of the segment scaled signal values is represented as a power of 2 multiplied by one of a small set of mantissa values.

Further, the initial filtering process can be chosen such that the inverse filter is composed of simplified coefficients.

In accordance with a further aspect of the present invention, there is provided a convolution method of time domain convolving an input signal with a second signal to produce a time domain output comprising the steps of: (a) dividing the second signal into a series of segments; (b) determining a magnitude envelope for each of the segments; (c) scaling the signal values within each segment relative to the envelope to produce corresponding segment scaled signal values; (d) multiplying the segment scaled signal values by a corresponding input signal value to produce corresponding segment output values; (e) summing the corresponding segment output values for each of the segment together to produce a summed segment output value for each of the segments; (f) scaling the summed segment output values by a segment scale factor to produce corresponding scaled segment outputs; (g) adding the scaled segment outputs to produce a time domain output.

The method can further comprise the step of initially filtering the coefficient values so as to alter the expected spectral error in accordance with predetermined requirements.

The present invention is ideally suited to the case where the second signal is an impulse response signal and the input signal is an audio input signal.

The present invention also discloses efficient forms of hardware and software implementations of the invention.

In accordance with a further aspect of the present invention, there is provided an apparatus for convolving a first signal comprising a first series of data values with a second signal comprising a second series of data values, the apparatus comprising: data input means for inputting the first series of data values in a consecutive manner to a first multiplier means; control input means for inputting control values representative of the second series of data values in a consecutive manner; first multiplier means for multiplying the data values by one of a predetermined number of first multiplier values as determined by a current input control value to produce a multiplied data value; adding means for adding the multiplied data value to a previously accumulated data value producing a current adder output value; scaling means for scaling the current adder output value by one of a predetermined number of first scaling values as determined by the current input control value to produce a new accumulated data value; and accumulator means for storing the accumulated data value.

The first multiplier means further can comprise a series of multiplier units each forming the product of a current data value with a constant; and a selection means interconnected to each of the multiplier units and adapted to select and output one of the products as the multiplied data value as determined by the current input control value. The first multiplier means further can comprise complementor means for complementing the multiplied data value.

The scaling means further can comprise a second series of multiplier units each forming the scaled product of the current adder output value with a constant; and a selection means interconnected to each of the multiplier units and adapted to select and output one of the scaled products as the new accumulated data value as determined by the current input control value.

In accordance with a further aspect of the present invention, there is provided an apparatus for convolving a first signal comprising a first series of data values with a second signal comprising a second series of data values, the apparatus comprising: data input means for inputting the first series of data values in a consecutive manner to a series of convolution units; control input means for inputting control values representative of the second series of data values in a consecutive delayed manner to each of the series of convolution units; a series of convolution units each adapted to convolve an inputted data value of the second series with the first signal under the control of an inputted current control value; wherein each of the convolution units calculate a convolution of the first signal with a different portion of the second signal in parallel.

BRIEF DESCRIPTION OF THE DRAWINGS

Notwithstanding any other forms which may fall within the scope of the present invention, preferred forms of the invention will now be described, by way of example only, with reference to the accompanying drawings in which.

DETAILED DESCRIPTION OF THE EMBODIMENTS

In the preferred embodiment, techniques are utilised to drastically reduce the amount of computation required to carry out a time domain convolution process of an input signal and impulse response. By utilising the fact that an impulse response has a significantly rapid decay of the magnitude of coefficients, it is possible to minimise the computational requirements in the convolution process.

Figure 4:
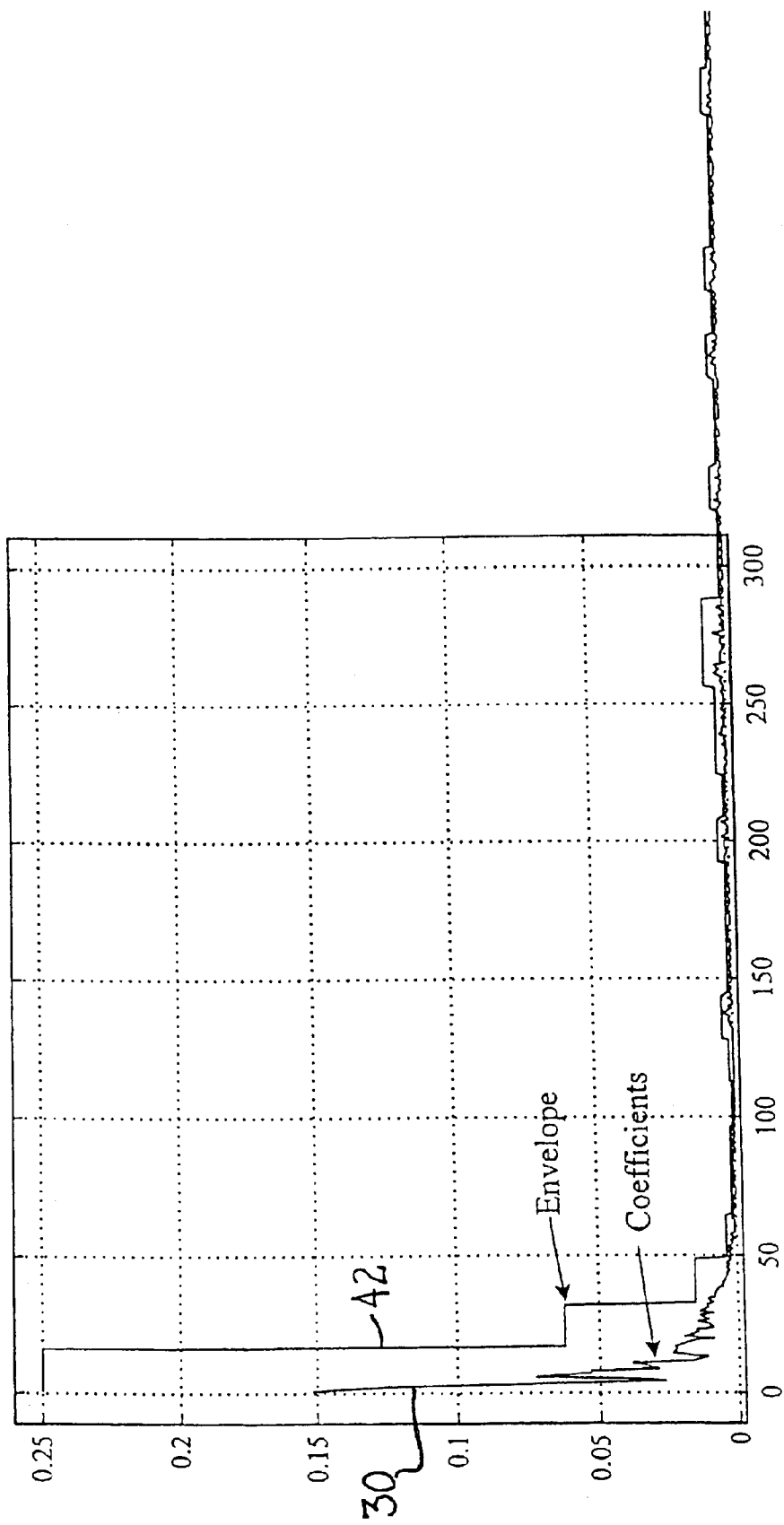
FIG. 4 illustrates an example impulse response.

Turning initially to FIG. 4, there is illustrated an example initial series of coefficients 30 of a measured impulse response (commonly utilised acoustic impulse responses for 48 K type signals are preferably in the range of 7000 taps). It can be seen that the impulse response 30 rapidly decays to a residual level. This is likely the result of energy dissipation in an audio environment in which the impulse response is measured. The rapid decay of the impulse response can be utilised so as to reduce the computational requirements in any convolution process. By utilising a process of scaling of the coefficients of the impulse response 30 and simultaneously limiting the number of bits (quantization) each coefficient is represented by, computational requirements can be substantially reduced.

Figure 1:
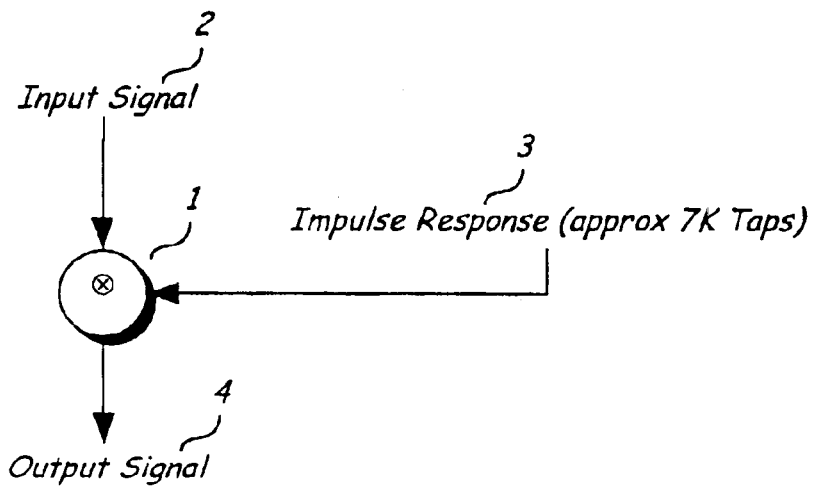
FIG. 1 illustrates the standard convolution process.
Figure 2:
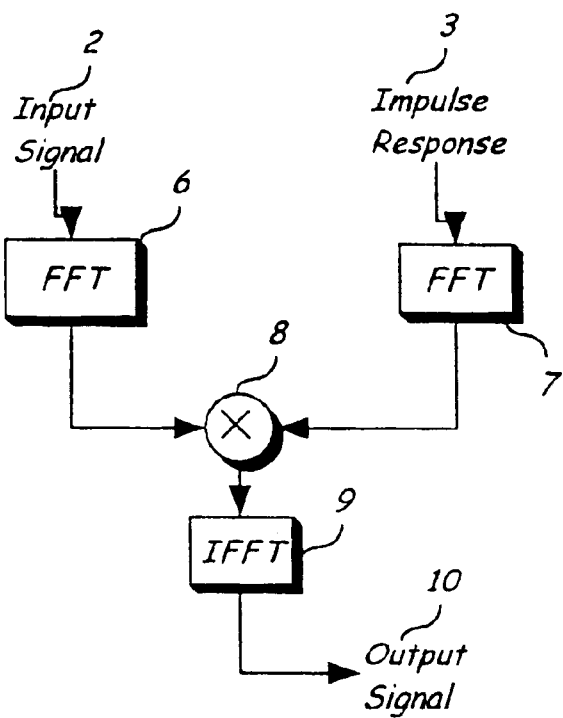
FIG. 2 illustrates a fourier domain convolution process.
Figure 3:
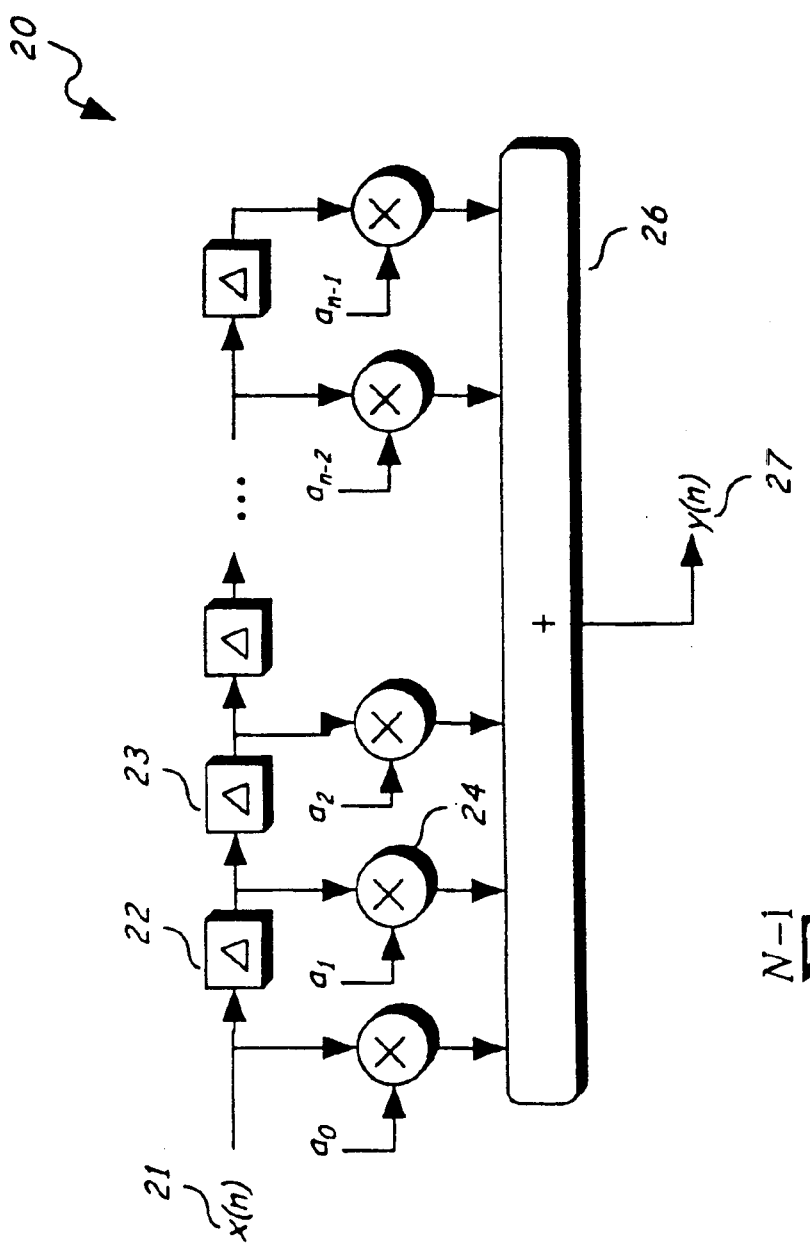
FIG. 3 illustrates a time domain convolution process.
Figure 5:
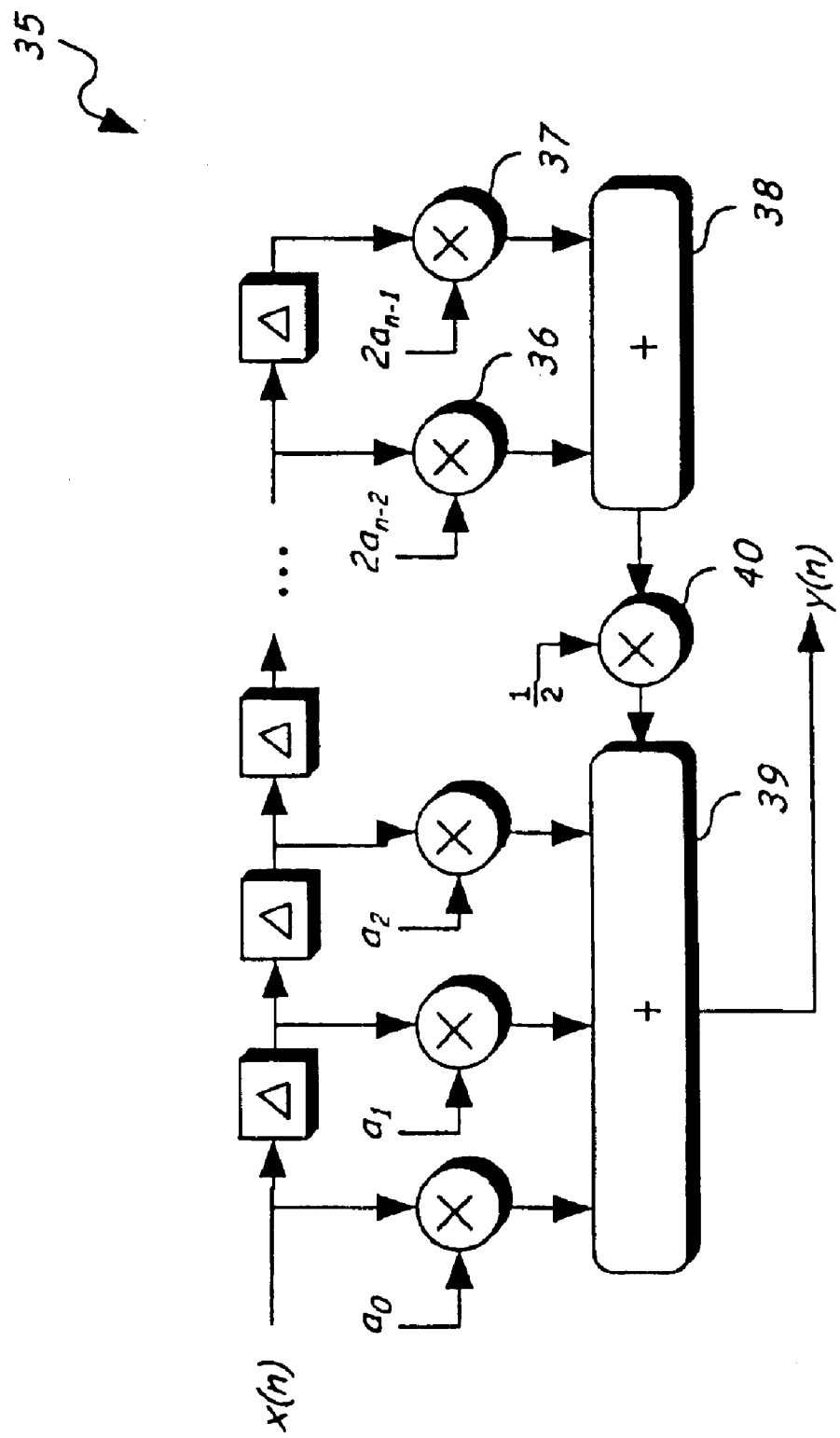
FIG. 5 illustrates the modified form of time domain convolution process of an embodiment.

An example of the resultant structure of a time domain filter utilising a scaling process is illustrated in FIG. 5. In FIG. 5, the coefficient $a_1-a_2$ are unchanged. However, the coefficients $a_{n-2}$ and $a_{n-1}$ are pre-multiplied by 2 so as to magnify the scale on which these coefficients are represented. Subsequently, the multiplication process is carried out 36, 37 before addition 38. Before the output from adder 38 is added 39 with the higher magnitude coefficients, the summation is divided by two 40. It will be evident that the arrangement 35 carries out the same summation as that previously illustrated in FIG. 3. However, the arrangement 35 lends itself to a number of simplifications which may have minimal effect on the difference in output results. Firstly, the multiplication and division by factors of 2 can be easily implemented in hardware utilising shift arithmetic. Further, the quantization or number of bits utilised at each stage in the multipliers and adders can be substantially reduced whilst maintaining reasonable accuracy of output results.

The process of scaling coefficients is akin to placing a maximum magnitude envelope 42 (FIG. 4) around the impulse response and rescaling the impulse coefficient values between 0 and the maximum envelope value.

The pseudo code of the convolution process can then be modified as follows:

```
// Input: x (k)
// Output: y (k)
// Coefs: a [0 .. N−1]
// Shifts: Sh [0 .. N−1]
y (k) = 0;
for (i = N−1; i > 0; i −−) {
    if Sh(i) {
        y(k) = (y(k)/2);
    }
    y(i) = y(k) + x(k−i) *a(i);
}
```

The array Sh[] is a boolean array with each element indicating whether or not to scale down the current accumulator value y(k).

In a more sophisticated system, Sh[] may be an array of multi-valued elements, indicating (for example) one of 4 operations:

Scale by ¼

Scale by ½

No Scale

Scale by 2

In some implementations (in hardware), the shift operation might only be applied on predetermined block boundaries (say, in blocks of 16 coefficients). For example, the arrangement of FIG. 4 is set so as to include an envelope which steps up or down on 16 step boundaries.

As a further optimisation, the coefficients can be quantised in a weighted manner. After being pre-emphasised prior to quantisation, the quantisation process (say to 4 bit quantisation) can be implemented utilising noise shaping to improve the response in particular frequency bands. The quantisation can be also non-uniform with, in one example over the range −32–32, the following quantizations being found to be suitable:

Quant=[−32−24−16−12−8−6−3−1 1 3 6 8 12 16 24 32];

This quantisation set is chosen to simplify the design of a multiplier based on the quantised coefficients. In this case, the multiplier need only be capable of computing the following:

if A is a member of the set [−32−24−16−12−8−6−3−1 1 3 6 8 12 16 24 32], then we define A' as being equal to 0 when A is an integer power of 2, and equal to 1 otherwise. Also, we define A" as being the largest integer such that $A*2^{-A"}$ is a whole number. Then, we can form the multiplication as:

$$A*B=(B+A'*(B<<1))<<A"$$

where the << operator signifies the left-shift operator, as used in the C and C++ programming languages.

In a further opimisation, the quantisation process is carried out using an opimisation technique that spectrally shapes the error, such that the error is minimised in the low-frequency portion of early part of the impulse response. Examples of suitable quantisation algorithms include noise-shaping, simulated annealing, or genetic optimisation algorithms.

Figure 6:
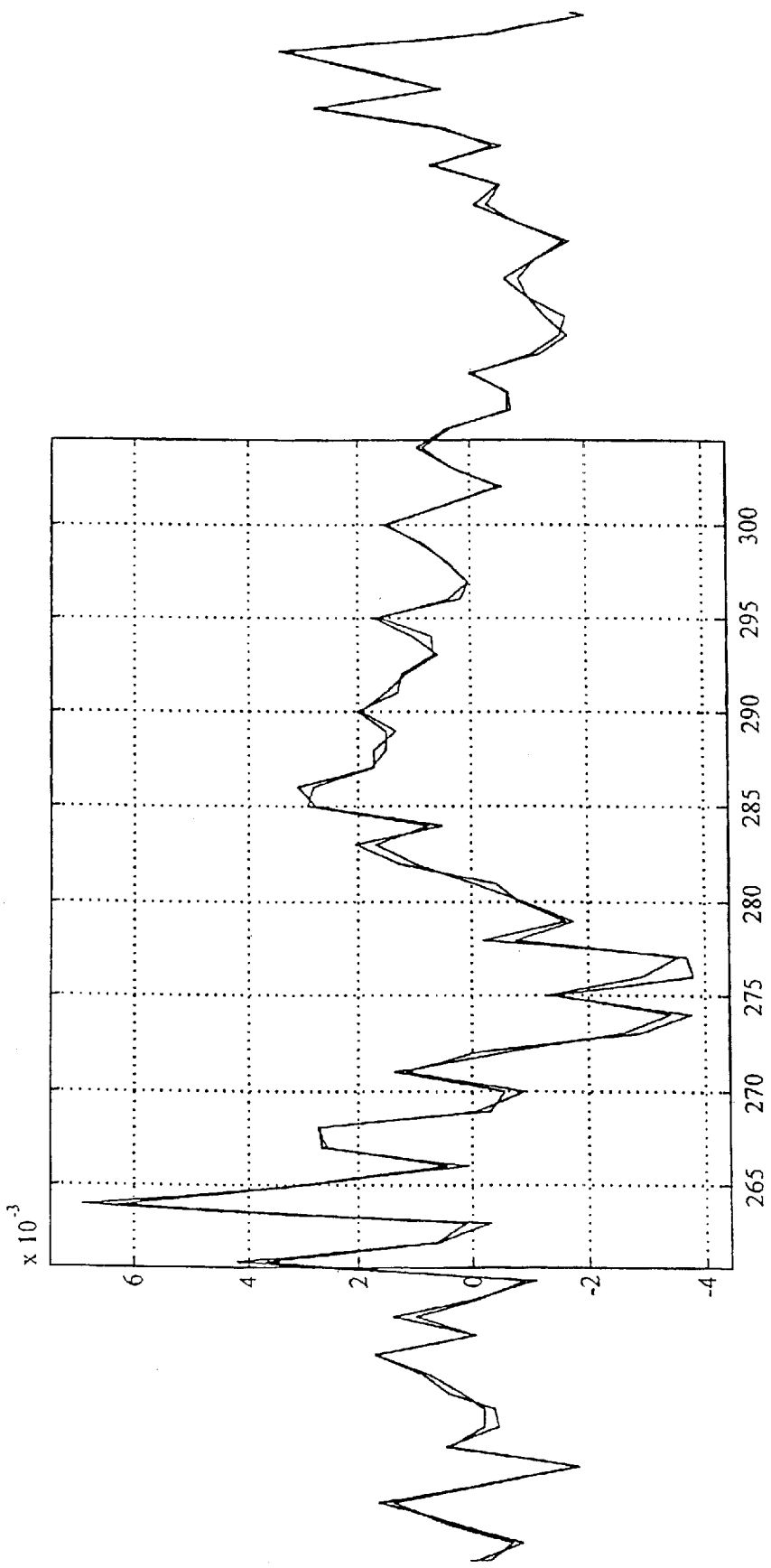
FIG. 6 illustrates the quantisation error associated with the quantisation process utilised in an embodiment.

By way of example, turning to FIG. 6, there is illustrated an original impulse response, suitably scaled, and its corresponding quantisation approximation using the above quantization levels. It can be seen that the approximation is in substantial agreement with the original.

Through the utilisation of coefficient scaling and effective quantisation, the computational requirements on a time domain convolution process are substantially reduced.

Figure 7:
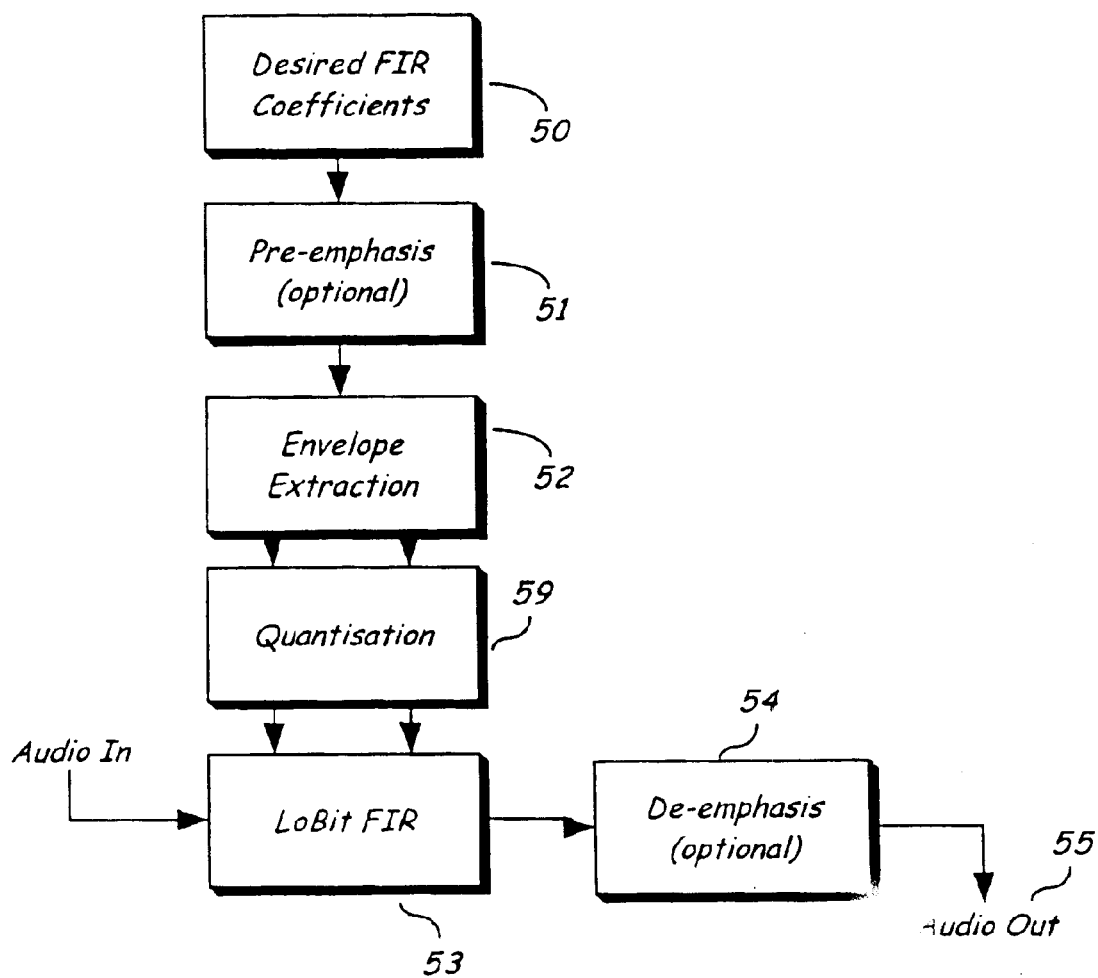
FIG. 7 illustrates the general flow chart of the operation of the preferred embodiment.

FIG. 7 illustrates an overall flow diagram of the resulting modified time domain convolution process. The desired impulse response coefficients 50 are first pre-emphasised 51 so as to minimise errors. (this step is optional) Next the envelope extraction process 52 is carried out so as to determine an appropriate envelope for a group of coefficients. Subsequently the coefficients are quantized 59 to one of a series of levels depending on the number of output levels chosen. The quantization process can proceed simply or can include complex noise minimization techniques which seek to minimize spectral aspects of the error components quantization components. Alternatively, the initial coefficients, which tend to be of far greater significance in audio applications can be more accurately represented at the expense of the tail components. Often however the simple quantization process is suitable.

The quantized coefficients are then utilized in the convolution process 53 so as to provide for finite impulse response filtering of the impulse response with an input signal. A subsequent optional de-emphasis process 54 can be carried out before producing audio output 55.

Example pre-emphasis and de-emphasis filters are as follows:

Pre-emphasis: $Pre(z)=1/(1+0.98z^{-1})$

De-emphasis: $De(z)+1=z^{-1}$

Figure 9:
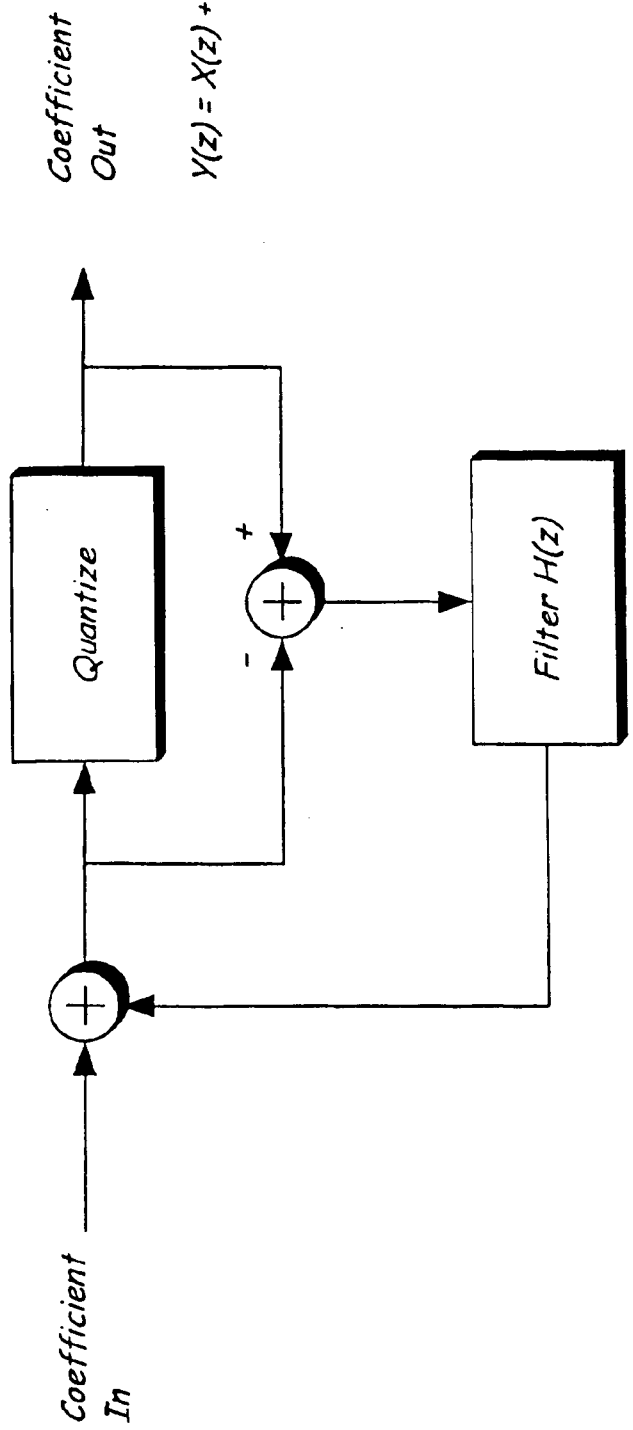
FIG. 9 illustrates the process of noise shaping.

The aim of the pre-emphasis process is to spectrally shape the noise so that noise levels are reduced in the audio range. An example of a suitable noise shaping filter is illustrated in FIG. 9.

Figure 8:
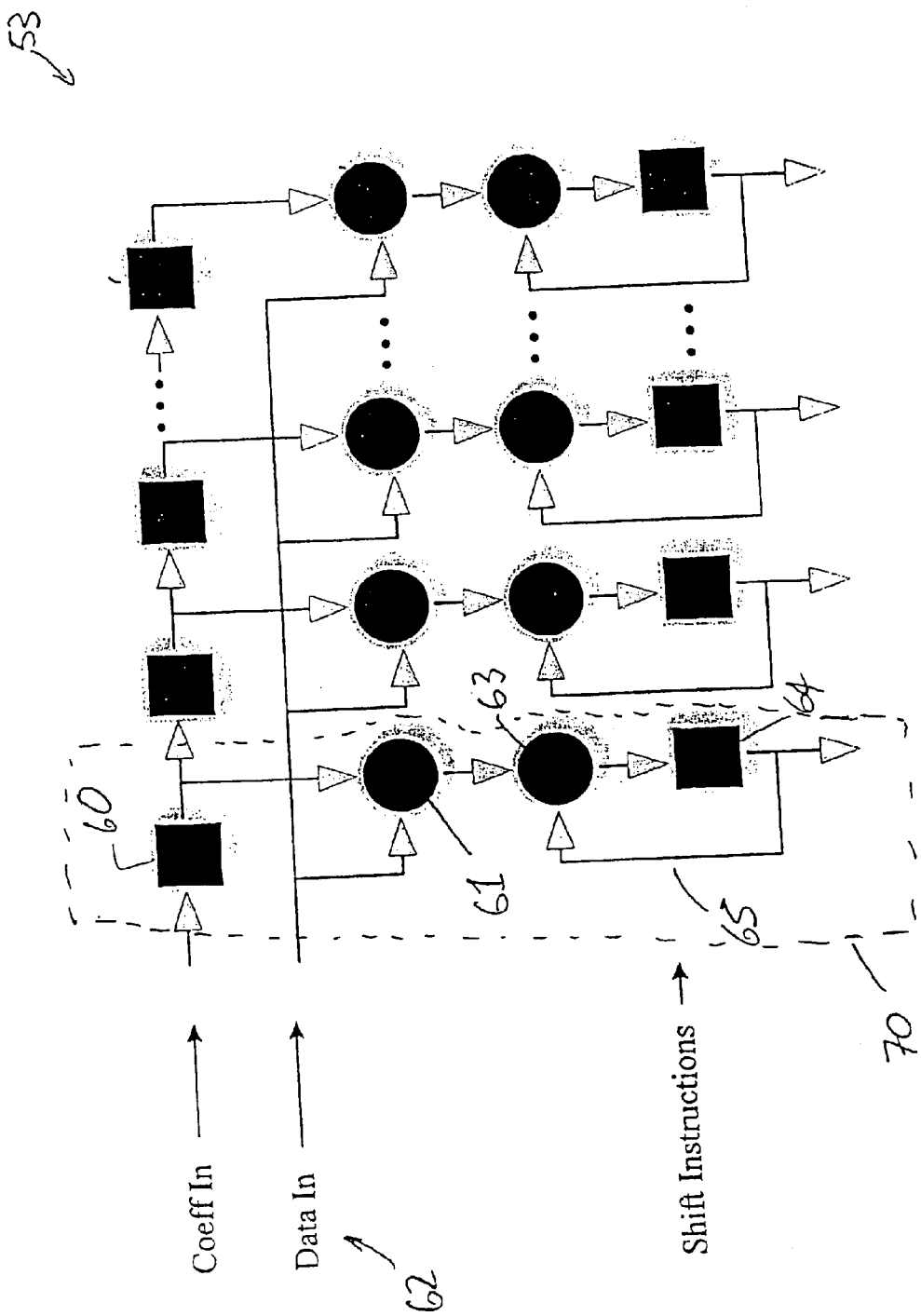
FIG. 8 illustrates an example hardware implementation of an embodiment.

A hardware implementation of FIG. 5 lends itself to significant parallelism and an example of an overall architecture is illustrated in FIG. 8. The input coefficients are fed to a series of delay blocks 60 with the outputs of the delay blocks being multiplied 61 with audio input data value 62. The output of the multiplier 61 is fed to summer 63 which also takes as an input the previous summation output stored in latch accumulator 64. The input 65 is suitably shifted so as to scale the coefficients. The unit 70 is repeated as many times as required so as to increase parallelism calculations in order to meet final output requirements.

An alternative form of calculation of the time domain convolving of an input signal, {x(k)}, with a set of coefficients, {a(n): 0<=n<N} can proceed by the steps of:

for input signal sample x(k), the multiplication calculation of each of x(k)*a(0), x(k−1*a(1), ... x(k−N+1)*a(N−1) and adding together the multiplied results to generate a single y(k) output is carried out via the following sequence of operations:

$Y=0$;

$Y=(Y+x(k-N+1)*a(N-1))*s(N-1)$;

$Y=(Y+x(k-N+2)*a(N-2))*s(N-2)$;

$Y=(Y+x(k-N+3)*a(N-3))*s(N-3)$;

...

$Y=(Y+x(0)*a(0))*s(0)$;

It can be seen that the accumulated sum {(Y)} is scaled by an appropriate scale factor s(n) after each term is added to it.

In a further embodiment, the scale factors s(n) are constrained to take the values 0.5, 1 or 2 so that they can be implemented by means of shift operations. The coefficients {a(n)} are also constrained to a simple set of coefficients, so that the resulting multiplication operation is also made simple. For example, the coefficients {a(n)} can be constrained to take values from the set {−4, −2, −1, 0, 1, 2, 4}, thus reducing the multiplication operation to a shift operation.

In a further embodiment, the scale factors can be stored in a compressed format, such that 4 consecutive scale factors are represented by a single 3-bit number, with the 4 corresponding scale factors being determined from a look-up table as follows:

| Encoded | Scale factors | | | |
|---|---|---|---|---|
| 000 | 1 | 1 | 1 | 1 |
| 001 | 1 | 1 | 1 | 0.5 |
| 010 | 1 | 0.5 | 1 | 0.5 |
| 011 | 1 | 0.5 | 0.5 | 0.5 |
| 100 | 1 | 1 | 1 | 2 |
| 101 | 1 | 2 | 1 | 2 |
| 110 | 1 | 2 | 2 | 2 |
| 111 | 2 | 2 | 2 | 2 |

Figure 10:
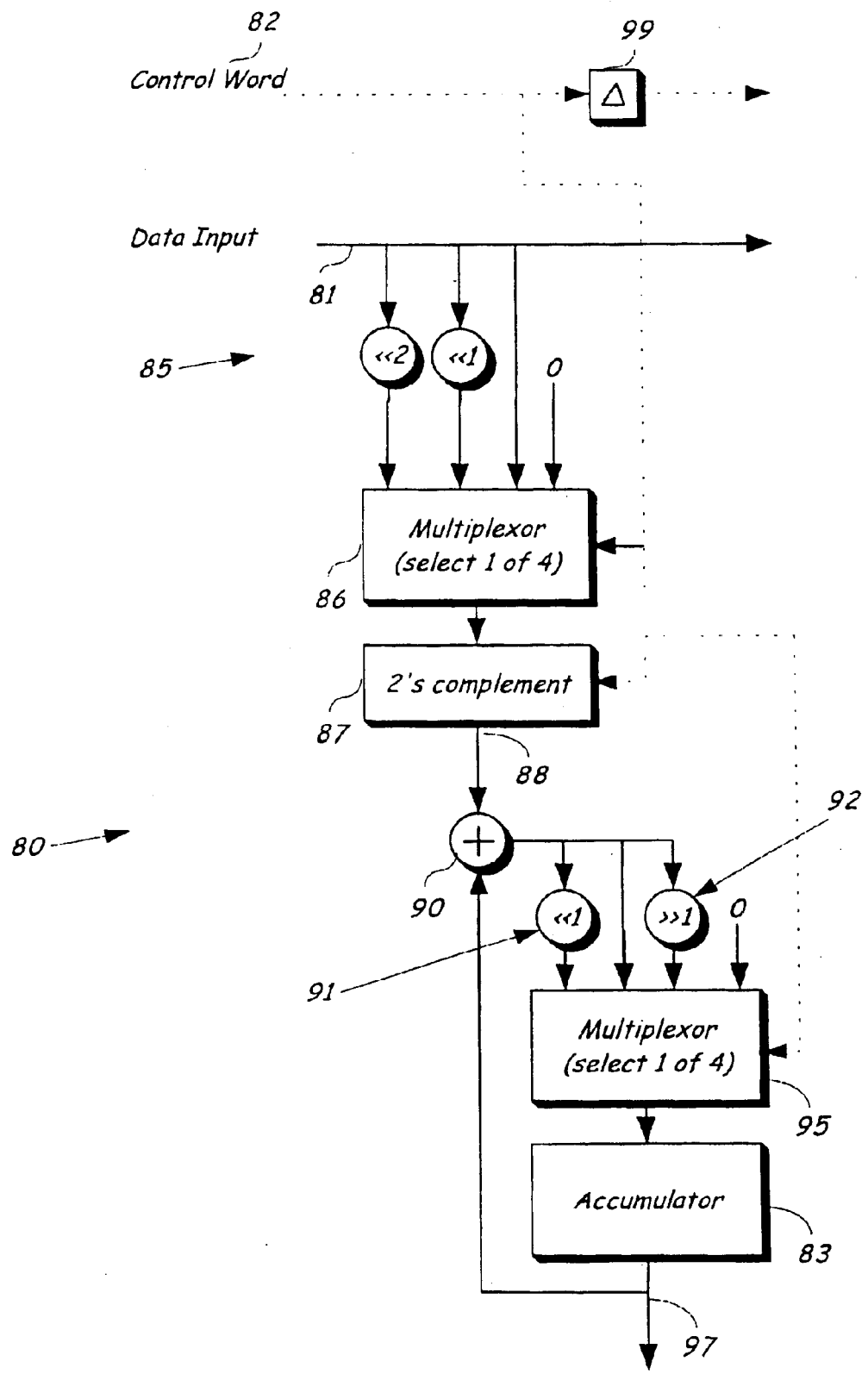
FIG. 10 illustrates a hardware implementation of the preferred embodiment.

One form of arrangement that implements the above method is shown in FIG. 10. In the arrangement 80, initially the control input 82 is activated so as to set the accumulator 83 to zero. The data values x(n) are input 81 one at a time wherein they are first multiplied by 0,1,2 or 4, with the multiplications being implemented by way of shift operations 85. The multiplexer 86 is used to choose the requisite output result. It is assumed a '2' s-complement' implementation is provided and a complementor 87 is provided to complement the multiplexor output under the control input signal. Hence the output 88 can be one of the input multiplied by one of {−4, −2, −1, 0, 1, 2, 4}. The adder 90 adds the output to the accumulated output which is subsequently multiplied or divided by two by means of shifters 91, 92. The multiplexor 95 selects the requisite signal as determined by input control signals. After each data value as been input, the output 97 forms the output value y(n). The control word 82 is determined so as to properly perform the requisite calculation depending on the impulse response coefficient structure.

Figure 11:
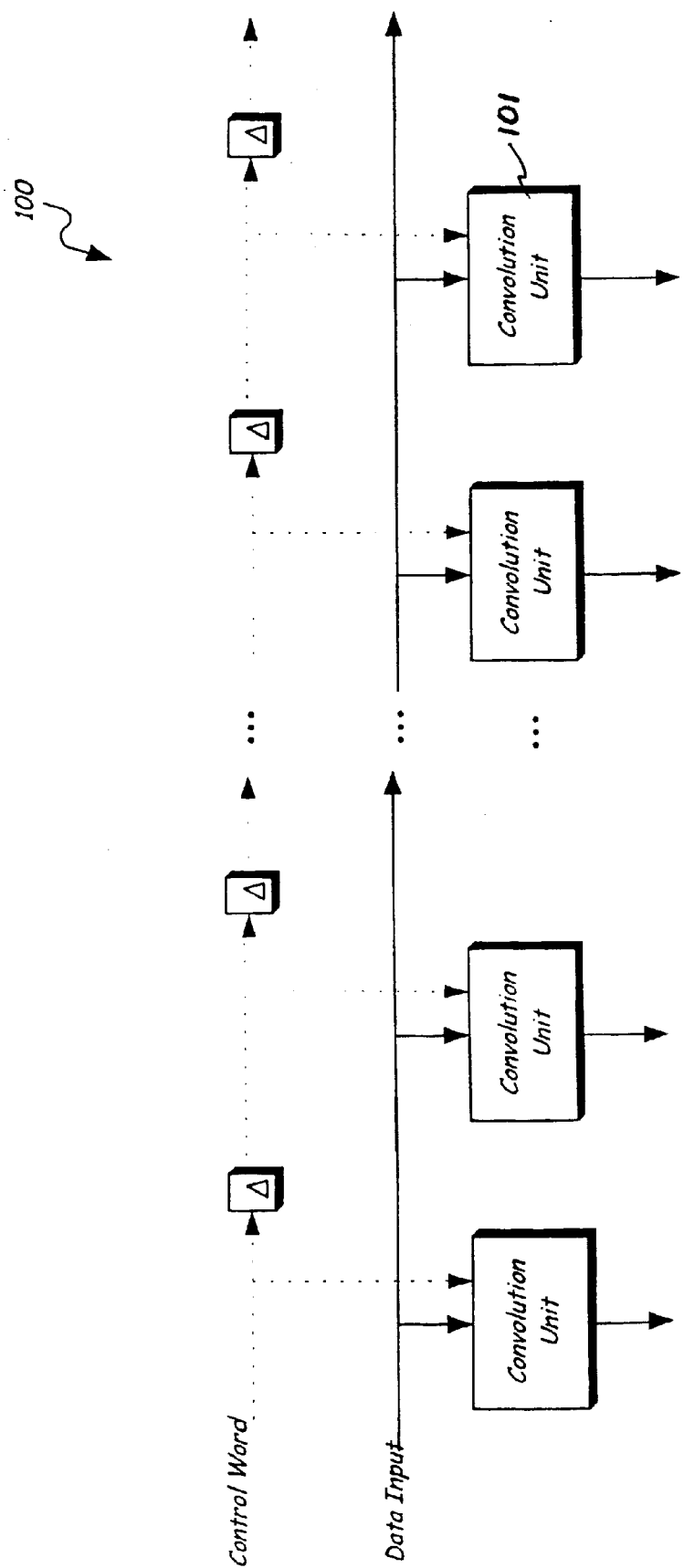
FIG. 11 illustrates a parallel form of implementation of the preferred embodiment.

Multiple units can be utilised in parallel with delay 99 being utilised to delay the control portion of the calculation such that each arrangement 80 outputs a different y(n) value in a staggered manner. An example of a cascaded system 100 is illustrated in FIG. 11 with multiple convolution units 101 etc providing for parallel calculation of outputs.

In this way, an array of shift-add circuits can be employed to compute several FIR filter output values simultaneously, thus allowing the arithmetic throughput of the circuit to be increased without increasing the data-memory and coefficient memory access speeds.

It will be readily evident to those skilled in the art of digital architectural design and in particular systolic arrays that other possible implementations could be provided.

It would be appreciated by a person skilled in the art that numerous variations and/or modifications may be made to the present invention as shown in the specific embodiments without departing from the spirit or scope of the invention as broadly described. The present embodiments are, therefore, to be considered in all respects to be illustrative and not restrictive.

What is claimed is:

1. A convolution method of time domain convolving an input signal with a second signal comprising the steps of:
    (a) dividing the second signal into a series of segments;
    (b) determining a magnitude envelope for each of the segments;
    (c) scaling signal values within each segment relative to the envelope to produce corresponding segment scaled signal values;
    (d) multiplying the segment scaled signal values by a corresponding input signal value to produce corresponding segment output values;
    (e) scaling the segment output values by a segment scale factor to produce corresponding scaled segment outputs;
    (f) adding the scaled segment outputs to produce a time domain output.

2. A method according to claim 1 wherein the scaling step (c) further comprises a quantization process of the signal values within each segment.

3. A method according to claim 2 wherein the quantization process is non-linear.

4. A method according to claim 2 wherein the segment scaled signal values are quantized so that quantization noise is spectrally altered to reduce the impact of the quantization process.

5. A method according to claim 4 wherein the second signal comprises an impulse response signal.

6. A method according to claim 5 wherein the quantization process is carried out using an optimization technique that spectrally shapes error in the quantization process, such that the error is minimized in a low-frequency portion of an early part of the impulse response signal.

7. A method according to claim 4 wherein the input signal comprises an audio input signal.

8. A method according to claim 2 wherein the quantization process is adapted to simplify use of the segment scaled signal values in a multiplication process.

9. A method according to claim 8 wherein the quantization process is further adapted so that each element of the segment scaled signal values is represented as a power of 2 multiplied by one of a small set of mantissa values.

10. A method according to claim 1 further comprising the step of initially filtering the signal values in the second signal so as to alter an expected spectral error in accordance with predetermined requirements, and applying an approximately inverse filter to the time domain output.

11. A method according to claim 10 wherein the step of initially filtering the signal values is chosen such that the inverse filter is composed of simplified coefficients.

12. A method according to claim 1 wherein the second signal comprises an impulse response signal.

13. A method according to claim 1 wherein the input signal comprises an audio input signal.

14. A convolution method of time domain convolving an input signal with a second signal comprising the steps of:
    (a) dividing the second signal into a series of segments;
    (b) determining a magnitude envelope for each of the segments;
    (c) scaling signal values within each segment relative to the envelope to produce corresponding segment scaled signal values;
    (d) multiplying the segment scaled signal values by a corresponding input signal value to produce corresponding segment output values;
    (e) summing the corresponding segment output values for each segment to produce a summed segment output value for each segment;
    (f) scaling the summed segment output values by a segment scale factor to produce corresponding scaled segment outputs;
    (g) adding the scaled segment outputs to produce a time domain output.

15. A method according to claim 14 wherein the scaling step (c) further comprises a quantization process of the signal values within each segment.

16. A method according to claim 15 wherein the quantization process is non-linear.

17. A method according to claim 15 wherein the quantization process is adapted to simplify use of the segment scaled signal values in a multiplication process.

18. A method according to claim 17 wherein the quantization process is further adapted so that each element of the segment scaled signal values is represented as a power of 2 multiplied by one of a small set of mantissa values.

19. A method according to claim 15 wherein the segment scaled signal values are quantized so that quantization noise is spectrally altered to reduce the impact of the quantization process.

20. A method according to claim 19 wherein the second signal comprises an impulse response signal.

21. A method according to claim 20 wherein the quantization process is carried out using an optimization technique that spectrally shapes error in the quantization process, such that the error is minimized in a low-frequency portion of an early part of the impulse response signal.

22. A method according to claim 19 wherein the input signal comprises an audio input signal.

23. A method according to claim 14 further comprising the step of initially filtering the signal values in the second signal so as to alter an expected spectral error in accordance with predetermined requirements, and applying an approximately inverse filter to the time domain output.

24. A method according to claim 23 wherein the step of initially filtering the signal values is chosen such that the inverse filter is composed of simplified coefficients.

25. A method according to claim 14 wherein the second signal comprises an impulse response signal.

26. A method according to claim 14 wherein the input signal comprises an audio input signal.

27. An apparatus for convolving a first signal comprising a first series of data values with a second signal comprising a second series of data values, the apparatus comprising:

data input means for consecutively inputting the first series of data values to a multiplier means, the multiplier means multiplying each of the data values of the first series by one of a predetermined number of multiplier values, as determined by a current input control value, to produce a multiplied data value;

control input means for consecutively inputting control values representative of the second series of data values to the multiplier means;

adding means for adding the multiplied data value to a previously accumulated data value, thereby producing a current adder output value;

scaling means for scaling the current adder output value by one of a predetermined number of first scaling values, as determined by the current input control value, to produce a new accumulated data value;

accumulator means for storing the new accumulated data value.

28. An apparatus according to claim 27 wherein the multiplier means further comprises:

a series of multiplier units each forming a product of a current data value of the first series with a constant;

a selection means interconnected to each of the multiplier units and adapted to select and output one of the products as the multiplied data value as determined by the current input control value.

29. An apparatus according to claim 28 wherein the multiplier means further comprises complementor means for complementing the multiplied data value.

30. An apparatus according to claim 28 wherein the scaling means further comprises:

a second series of multiplier units each forming the scaled product of the current adder output value with a constant;

a second selection means interconnected to each of the multiplier units in the second series and adapted to select and output one of the scaled products as the new accumulated data value as determined by the current input control value.

31. An apparatus according to claim 27 wherein the multiplier means further comprises complementor means for complementing the multiplied data value.

32. An apparatus according to claim 27 wherein the multiplier values include 2 or 4.

33. An apparatus according to claim 27 wherein the scaling means further comprises:

a series of multiplier units each forming the scaled product of the current adder output value with a constant;

a selection means interconnected to each of the multiplier units and adapted to select and output one of the scaled products as the new accumulated data value as determined by the current input control value.

* * * * *